United States Patent
Shigeta et al.

(10) Patent No.: US 6,962,726 B2
(45) Date of Patent: Nov. 8, 2005

(54) METHOD FOR PREPARING SUBSTRATE FOR FLEXIBLE PRINT WIRING BOARD, AND SUBSTRATE FOR FLEXIBLE PRINT WIRING BOARD

(75) Inventors: Akira Shigeta, Kyoto (JP); Takeshi Yoshida, Kyoto (JP); Jun-ichi Mori, Kyoto (JP); Yoshiaki Echigo, Kyoto (JP); Ryoichi Hasegawa, Saitama (JP); Minoru Noji, Gunma (JP); Seiichi Hayashi, Saitama (JP); Makoto Uchida, Saitama (JP)

(73) Assignees: Unitika Ltd., Hyogo (JP); Nippon Kayaku Kabushiki Kaisha, Tokyo (JP)

( * ) Notice: Subject to any disclaimer, the term of this patent is extended or adjusted under 35 U.S.C. 154(b) by 363 days.

(21) Appl. No.: 10/258,057

(22) PCT Filed: Jun. 11, 2001

(86) PCT No.: PCT/JP01/04926

§ 371 (c)(1),
(2), (4) Date: Oct. 17, 2002

(87) PCT Pub. No.: WO01/97578

PCT Pub. Date: Dec. 20, 2001

(65) Prior Publication Data

US 2003/0108748 A1 Jun. 12, 2003

(30) Foreign Application Priority Data

Jun. 16, 2000 (JP) .................................. 2000-180659
Mar. 19, 2001 (JP) .................................. 2001-77370

(51) Int. Cl.$^7$ ................................................ B05D 5/12
(52) U.S. Cl. .................... 427/96.1; 427/384; 427/402
(58) Field of Search ............................... 427/96.1, 384, 427/402; 428/209, 901

(56) References Cited

U.S. PATENT DOCUMENTS

| | | | | |
|---|---|---|---|---|
| 3,476,705 A | * | 11/1969 | Hansen | 428/379 |
| 3,486,934 A | | 12/1969 | Bond | 428/458 |
| 4,675,246 A | | 6/1987 | Kundinger et al. | 428/336 |
| 4,916,009 A | * | 4/1990 | Hino et al. | 428/220 |
| 5,137,751 A | * | 8/1992 | Burgess et al. | 427/123 |
| 5,300,364 A | * | 4/1994 | Hase et al. | 428/458 |
| 5,570,506 A | * | 11/1996 | Tawata et al. | 29/851 |
| 6,160,081 A | * | 12/2000 | Tanaka et al. | 527/170 |

FOREIGN PATENT DOCUMENTS

| | | | |
|---|---|---|---|
| EP | 335337 | | 10/1989 |
| EP | 498898 A1 | | 3/1992 |
| EP | 498898 | * | 3/1992 |
| JP | 01-245586 | * | 9/1989 |

* cited by examiner

*Primary Examiner*—Brian K. Talbot
(74) *Attorney, Agent, or Firm*—Fildes & Outland, P.C.

(57) ABSTRACT

A method for preparing a substrate for a flexible print wiring board having a polyimide based resin layer wherein a solution of a polyimide based resin precursor is directly applied on an electrically conducting material to form a polyimide based resin precursor layer and then the precursor layer is cured by heating to prepare a polyimide based resin layer, characterized in that a solution of a polyimide based resin precursor B, which is one of solutions of two types of polyimide based resin precursors, is directly applied on an electrically conducting material and then, on the resultant layer is applied a solution of a polyimide based resin precursor A which allows resolving the residual strain generated in the polyimide based resin formed by the curing of the above polyimide based resin precursor B.

7 Claims, No Drawings

US 6,962,726 B2

METHOD FOR PREPARING SUBSTRATE FOR FLEXIBLE PRINT WIRING BOARD, AND SUBSTRATE FOR FLEXIBLE PRINT WIRING BOARD

TECHNICAL FIELD

The present invention relates to a method for preparing a substrate for a flexible print wiring board, and to a substrate for a flexible print wiring board. More specifically, the invention relates to a method for preparing a substrate for a flexible print wiring board, and to a substrate for a flexible print wiring board, the substrate being free from a curl, a twist and a warp after formation of circuitry thereon and excellent in heat resistance, dimensional stability, adhesion and electrical properties.

BACKGROUND ART

Conventionally, substrates for flexible print wiring boards are produced by combining an electrically conducting material with an insulator such as a polyimide film or a polyester film with the intervention of an adhesive such as of an epoxy resin or an acrylic resin. However, a substrate for a substrate for a flexible print wiring board produced by such a method is inferior in heat resistance and flame resistance because of the intervention of an adhesive layer. In addition, the substrate suffers from a greater dimensional variation when the electrically conducting material is etched or when the substrate is subjected to a certain heat treatment, thereby causing trouble in subsequent steps.

To solve such drawbacks, an attempt is made to produce a flexible print substrate by forming a polyimide-based resin layer directly on an electrically conducting material without the intervention of an adhesive layer. For example, Japanese Unexamined Patent Publication No. 60-157286 (1985) proposes a method for producing a substrate for a flexible print wiring board, wherein a solution of a polyimide precursor having a specific structure is applied directly on an electrically conducting material and then cured. However, when the electrically conducting material is partly etched away for formation of circuitry on the substrate for a flexible print wiring board produced by this method, the substrate is significantly curled with its conductor-etched surface facing inward. This presents a problem that electronic components cannot accurately be mounted on the substrate in a subsequent step, for example, in an electronic component mounting step. To solve this problem, Japanese Unexamined Patent Publications No. 1-245586 (1989), No. 4-274385 (1992) and No. 8-250860 (1996) propose methods, in which a laminate consisting of a plurality of polyimide-based resin layers having different thermal expansion coefficients is formed as the insulative polyimide-based resin layer on the electrically conducting material. However, these methods still fail to satisfactorily solve the problem associated with the curling.

DISCLOSURE OF INVENTION

To solve the aforesaid problem, it is an object of the present invention to provide a method for preparing a substrate for a flexible print wiring board and to provide a substrate for a flexible print wiring board, the substrate being virtually free from a curl, a twist and a warp after formation of circuitry thereon and excellent in heat resistance, dimensional stability, adhesion and electrical properties.

As a result of intensive studies to solve the aforesaid problem, the inventors of the present invention have found that the intended substrate for a flexible print wiring board can be obtained by employing two specific polyimide resin precursors for formation of a polyimide resin layer, and achieved the present invention.

To solve the aforesaid problem, a production method for a substrate for a flexible print wiring board according to the present invention comprises: applying a polyimide-based resin precursor solution directly on an electrically conducting material for formation of a polyimide-based resin precursor layer; and thermalcuring the polyimide-based resin precursor layer for production of a flexible print wiring substrate having a polyimide-based resin layer; wherein a solution of one polyimide-based resin precursor (B) out of two types of polyimide-based resin precursors is applied directly on the electrically conducting material; wherein a solution of the other polyimide-based resin precursor (A) is applied on a layer of the polyimide-based resin precursor (B), the polyimide-based resin precursor (A) being capable of relieving a residual strain occurring in a polyimide-based resin resulting from thermalcuring of the polyimide-based resin precursor (B).

A flexible print wring board substrate according to the present invention is produced by the aforesaid production method.

Thus, the residual strain occurring in the polyimide-based resin layer due to shrinkage of the layer during the thermalcuring is relieved, whereby a curl, a twist and a warp of the substrate can be suppressed.

A production method of the present invention comprises: applying a polyimide-based resin precursor solution directly on an electrically conducting material for formation of a polyimide-based resin precursor layer; and thermalcuring the polyimide-based resin precursor layer for production of a flexible print wiring substrate having a polyimide-based resin layer; wherein a solution of one polyimide-based resin precursor (B) out of two types of polyimide-based resin precursors is applied directly on the electrically conducting material; wherein a solution of the other polyimide-based resin precursor (A) is applied on a layer of the polyimide-based resin precursor (B), the polyimide-based resin precursor (A) being capable of relieving a residual strain occurring in a polyimide-based resin resulting from thermalcuring of the polyimide-based resin precursor (B).

In a production method of the invention, a polyimide-based resin precursor having a higher thermalcuring rate than the polyimide-based resin precursor (B) is employed as the polyimide-based resin precursor (A).

In a production method of the invention, a polyimide-based resin precursor having a thermalcuring rate index higher than that of the polyimide-based resin precursor (B) by not smaller than 10% is employed as the polyimide-based resin precursor (A).

In a production method of the invention, a polyimide-based resin precursor having a thermalcuring rate index higher than that of the polyimide-based resin precursor (B) by not smaller than 30% is employed as the polyimide-based resin precursor (A).

In a production method of the invention, the polyimide-based resin precursor (B) comprises a polyamic acid, or a salt or a mixture of a diamine represented by the following structural formula (1) and a tetracarboxylic acid derivative represented by the following structural formula (2), and the polyimide-based resin precursor (A) comprises a polyamic acid, or a salt or a mixture of a diamine represented by the following structural formula (1) and a tetracarboxylic acid derivative represented by the following structural formula (2), and the content of the tetracarboxylic acid derivative in the polyimide-based resin precursor (A) is greater than the content of the tetracarboxylic acid derivative in the polyimide-based resin precursor (B),

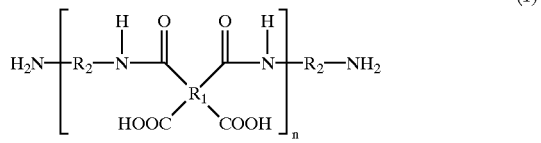

(1)

wherein $R_1$ is a tetravalent aromatic residue, $R_2$ is a divalent aromatic residue, and n is a real number not smaller than one which represents an average number,

(2)

wherein $R_3$ is a tetravalent aromatic residue, and $R_4$ is a hydrogen atom or an alkyl group.

In a production method of the invention, the polyimide-based resin precursor (B) comprises a polyamic acid, a trialkylamine derivative of the polyamic acid, or a mixture of the polyamic acid and the trialkylamine derivative, and the polyimide-based resin precursor (A) comprises a polyamic acid, a trialkylamine derivative of the polyamic acid, or a mixture of the polyamic acid and the trialkylamine derivative and has a greater trialkylamine content than the polyimide-based resin precursor (B).

A production method of the invention comprises: applying a polyimide-based resin precursor solution directly on an electrically conducting material to form a polyimide-based resin precursor layer; and thermalcuring the polyimide-based resin precursor layer for production of a flexible print wiring substrate having a polyimide-based resin layer; wherein a solution of a polyimide-based resin precursor (B) comprising a polyamic acid, or a salt or a mixture of a diamine represented by the following structural formula (1) and pyromellitic acid or biphenyl-3,4,3',4'-tetracarboxylic acid is applied directly on the electrically conducting material; wherein a solution of a polyimide-based resin precursor (A) comprising a polyamic acid, or a salt or a mixture of a diamine represented by the following structural formula (1) and pyromellitic acid or biphenyl-3,4,3',4'-tetracarboxylic acid and containing pyromellitic acid or biphenyl-3,4,3',4'-tetracarboxylic acid in a greater amount than the polyimide-based resin precursor (B) is applied on a layer of the polyimide-based resin precursor (B).

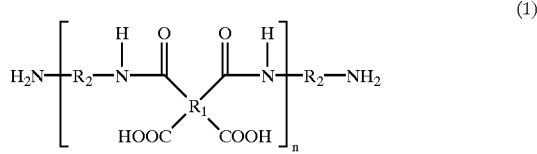

(1)

wherein $R_1$ is a tetravalent aromatic residue, $R_2$ is a divalent aromatic residue, and n is a real number not smaller than one which represents an average number.

A production method of the invention comprises: applying a polyimide-based resin precursor solution directly on an electrically conducting material to form a polyimide-based resin precursor layer; and thermalcuring the polyimide-based resin precursor layer for production of a flexible print wiring substrate having a polyimide-based resin layer; wherein a solution of a polyimide-based resin precursor (B) comprising a polyamic acid, a triethylamine derivative of the polyamic acid or a mixture of the polyamic acid and the triethylamine derivative is applied directly on the electrically conducting material; wherein a solution of a polyimide-based resin precursor (A) comprising a polyamic acid, a triethylamine derivative of the polyamic acid or a mixture of the polyamic acid and the triethylamine derivative and containing triethylamine in a greater amount than the polyimide-based resin precursor (B) is applied on a layer of the polyimide-based resin precursor (B).

A substrate for a flexible print wiring board of the invention is produced by a production method.

The present invention will hereinafter be described in detail.

In the following explanation, the polyimide-based resin precursor (A), the polyimide-based resin precursor (B), the solution of the polyimide-based resin precursor (A) and the solution of the polyimide-based resin precursor (B) are referred to simply as "precursor (A)", "precursor (B)", "solution (A)" and "solution (B)", respectively.

In the present invention, the polyimide-based resins are intended to include heat resistant resins such as polyimides, polyamide-imides, polybenzimidazoles and polyimide esters. The polyimide-based resins preferably each comprise a polyimide resin as a main component thereof. Therefore, the polyimide-based resin precursors are imidized into the polyimide-based resins.

In the present invention, a polyimide-based resin precursor having a higher thermalcuring rate than the precursor (B) is preferably employed as the precursor (A).

The thermalcuring rate of the polyimide-based resin precursor is determined, for example, in the following manner.

A varnish of the polyimide-based resin precursor is applied on a 3-mm thick glass plate, and heat-treated at 350° C. for two hours. Then, the resulting coated film is peeled off at a room temperature, and sufficiently pulverized in an agate mortar. The resulting powder is homogeneously mixed with fine KBr powder in the mortar, and the resulting mixture is pressed into a KBr disk by means of a press machine. After the KBr disk is dried in a desiccator for not shorter than 12 hours, an infrared spectrum is obtained with the use of the KBr disk by means of a Fourier transformation infrared spectrophotometer System-2000 (with a TGS detector for 64-time integration) available from the Perkin-Elmer Corporation.

That is, an absorbance $a_1$ based on absorption at 1770 $cm^{-1}$ attributable to imide carbonyl bonds and an absorbance $a_2$ based on absorption at 1500 $cm^{-1}$ attributable to C—H bonds of a benzene ring are determined, and an absorbance ratio a is calculated from the following expression:

$a$=absorbance $a_1$/absorbance $a_2$

Then, an infrared spectrum is obtained in substantially the same manner as described above, except that the heat treatment is performed at a temperature of 160° C. for 10 minutes. An absorbance $b_1$ based on absorption at 1770 $cm^{-1}$ attributable to imide carbonyl bonds and an absorbance $b_2$ based on absorption at 1500 $cm^{-1}$ attributable to C—H bonds of a benzene ring are determined, and an absorbance ratio b is calculated from the following expression:

$b$=absorbance $b_1$/absorbance $b_2$

Thereafter, a thermalcuring rate index c is calculated from (a/b)×100(%). The thermalcuring rate index c indicates the imide ring opening ratio of the polyimide-based resin precursor. The higher the value of the thermalcuring rate index, the higher the thermalcuring rate of the polyimide-based resin precursor.

In the present invention, a polyimide-based resin precursor having a thermalcuring rate index higher than that of the precursor (B) by not smaller than 10% is preferably employed as the precursor (A).

In the present invention, a polyimide-based resin precursor having a thermalcuring rate index higher than that of the precursor (B) by not smaller than 30% is more preferably employed as the precursor (A).

In the present invention, preferred examples of the polyimide-based resin precursors are as follows.

A polyimide-based resin precursor comprising a polyamic acid, a trialkylamine derivative of the polyamic acid or a mixture of the polyamic acid and the trialkylamine derivative is employed as the precursor (B). A polyimide-based resin precursor comprising a polyamic acid, a trialkylamine derivative of the polyamic acid or a mixture of the polyamic acid and the trialkylamine derivative and having a greater trialkylamine content than the precursor (B) is employed as the precursor (A). The precursor (B) may contain no trialkylamine.

Alkyl groups in the trialkylamine derivative of the polyamic acid preferably each have a carbon number of 1 to 10. The alkyl groups in the trialkylamine derivative may be linear, branched or cyclic. The three alkyl groups may be the same or different.

Examples of the trialkylamine derivative of the polyamic acid include a trimethylamine derivative, a triethylamine derivative, a triisopropylamine derivative, a tri(n-propyl)amine derivative, a triisobutylamine derivative, a tri(n-butyl)amine derivative, a tri(t-butyl)amine derivative, a cyclohexyldimethylamine derivative and a butyldimethylamine derivative of the polyamic acid, but not limited thereto. The trialkylamine preferably has a boiling point of not higher than 200° C. so as to evaporate together with a solvent at imidization.

Other preferred examples of the polyimide-based resin precursors are as follows.

A polyimide-based resin precursor comprising a polyamic acid, or a salt or a mixture of a diamine represented by the aforesaid structural formula (1) and a tetracarboxylic acid derivative represented by the aforesaid structural formula (2) is employed as the precursor (B). A polyimide-based resin precursor comprising a polyamic acid, or a salt or a mixture of a diamine represented by the aforesaid structural formula (1) and a tetracarboxylic acid derivative represented by the aforesaid structural formula (2) and containing the tetracarboxylic acid derivative in a greater amount than the precursor (B) is employed as the precursor (A). The precursor (B) may contain no tetracarboxylic acid derivative.

Usable as the electrically conducting material in the present invention are metal foils made from metals such as copper, aluminum, iron, silver, palladium, nickel, chromium, molybdenum, tungsten, and alloys of any of these metals. Among these metal foils, a copper foil is most preferable.

The electrically conducting material may be subjected to a chemical or mechanical surface treatment for improvement of the adhesion thereof to the polyimide-based resin. Examples of the chemical surface treatment include plating treatments such as plating with nickel and plating with a copper-zinc alloy, and treatments with an aluminum alcoholate, an aluminum chelate and a silane coupling agent. A silane coupling agent having an amino group is preferably employed as the silane coupling agent. An exemplary mechanical surface treatment is sand-blasting.

The polyimide-based resin precursors are applied as solutions thereof on the electrically conducting material. Exemplary solvents to be employed for dissolving the polyimide-based resin precursors include non-protonic polar solvents, ether compounds and water-soluble alcohol compounds.

Examples of the non-protonic polar solvents include N-methyl-2-pyrrolidone, N,N-dimethylformamide, N,N-dimethylacetamide, dimethyl sulfoxide and hexamethylphosphoramide.

Examples of the ether compounds include 2-methoxyethanol, 2-ethoxyethanol, 2-(methoxymethoxy) ethoxyethanol, 2-isopropoxyethanol, 2-butoxyethanol, tetrahydrofurfuryl alcohol, diethylene glycol, diethylene glycol monomethyl ether, diethylene glycol monoethyl ether, diethylene glycol monobutyl ether, triethylene glycol, triethylene glycol monoethyl ether, tetraethylene glycol, 1-methoxy-2-propanol, 1-ethoxy-2-propanol, dipropylene glycol, dipropylene glycol monomethyl ether, dipropylene glycol monoethyl ether, tripropylene glycol monomethyl ether, polyethylene glycol, polypropylene glycol, tetrahydrofuran, dioxane, 1,2-dimethoxyethane, diethylene glycol dimethyl ether, and diethylene glycol diethyl ether.

Examples of the water-soluble alcohol compounds include methanol, ethanol, 1-propanol, 2-propanol, tert-butyl alcohol, ethylene glycol, 1,2-propandiol, 1,3-propandiol, 1,3-butandiol, 1,4-butandiol, 2,3-butandiol, 1,5-pentandiol, 2-buten-1,4-diol, 2-methyl-2,4-pentandiol, 1,2,6-hexantriol, and diacetone alcohol.

These solvents may be used as a mixture of two or more of them. Among these solvents, it is preferred to use N,N-dimethylacetamide or N-methyl-2-pyrrolidone alone. It is also preferred to use a combination of N,N-dimethylacetamide and N-methyl-2-pyrrolidone, a combination of N-methyl-2-pyrrolidone and methanol, or a combination of N-methyl-2-pyrrolidone and 2-methoxyethanol as a solvent mixture.

Next, an explanation will be given to how to prepare the polyimide-based resin precursors.

First, the solution of the polyamic acid is prepared by allowing an aromatic tetracarboxylic dianhydride represented by the following structural formula (3) and an aromatic diamine represented by the following structural formula (4) to react with each other in any of the aforesaid solvents, e.g., in a non-protonic polar solvent.

(3)

wherein $R_1$ is a tetravalent aromatic residue, $$H_2N-R_2-NH_2 \qquad (4)$$

wherein $R_2$ is a divalent aromatic residue.

For the aforesaid reaction, the proportion of the tetracarboxylic dianhydride is preferably 1.03 to 0.97 mol, more preferably 1.01 to 0.99 mol, based on 1 mol of the diamine. A reaction temperature is preferably −30 to 60° C., more preferably −20 to 40° C.

In the aforesaid reaction, the mixing order of the monomers and the solvent is not particularly limited, but the monomers and the solvent may be mixed in any order. Where a solvent mixture is employed as the solvent, the solution of the polyamic acid is obtained by dissolving or dispersing the respective monomers in different solvents, mixing the resulting solutions or dispersions together, and allowing the monomers to react with each other with stirring at a predetermined temperature for a predetermined period.

The trialkylamine derivative of the polyamic acid is obtained, for example, by adding 0.2 to 1.0 mol, preferably 0.3 to 0.8 mol, of the trialkylamine based on 1 mol of carboxyl groups of the polyamic acid to the solution of the polyamic acid in the non-protonic polar solvent obtained in the aforesaid manner, and allowing the trialkylamine and the polyamic acid to react with each other at 10 to 90° C., preferably at 20 to 80° C. Alternatively, the trialkylamine derivative of the polyamic acid can be obtained by addition of the trialkylamine during the preparation of the polyamic acid.

The solution (A) and the solution (B) are different in the content of the trialkylamine derivative. The precursor (A) is preferably present in a greater proportion than the precursor (B) by not smaller than 1% by mass, more preferably not smaller than 2% by mass, based on the total weight of the precursors (A) and (B).

The solution of the polyimide-based resin precursor comprising the salt of the diamine represented by the structural formula (1) and the tetracarboxylic acid derivative represented by the structural formula (2) is prepared by adding the tetracarboxylic acid derivative represented by the structural formula (2) to the solution of the diamine represented by the structural formula (1).

An explanation will be given to a preferred example of a method for preparing the polyimide resin precursor solution by allowing the tetracarboxylic dianhydride and the diamine to react with each other in the non-protonic polar solvent to prepare the solution of the diamine represented by the structural formula (1), and adding the tetracarboxylic acid derivative represented by the structural formula (2) to the diamine solution.

First, the aromatic tetracarboxylic dianhydride represented by the structural formula (3) and the aromatic diamine represented by the structural formula (4) are allowed to react with each other in the non-protonic polar solvent to prepare the solution of the diamine represented by the structural formula (1).

For the reaction of the tetracarboxylic dianhydride and the diamine for the preparation of the diamine represented by the structural formula (1), the proportion of the tetracarboxylic dianhydride is preferably 0.50 to 0.95 mol, more preferably 0.60 to 0.90 mol, based on 1 mol of the diamine. A reaction temperature is preferably −30 to 60° C., more preferably −20 to 40° C.

Then, the aromatic tetracarboxylic acid derivative represented by the structural formula (2) is added to the solution of the diamine represented by the structural formula (1), whereby the solution of the polyimide resin precursor comprising the salt of the diamine and the aromatic tetracarboxylic acid derivative is prepared.

The aromatic tetracarboxylic acid derivative represented by the structural formula (2) is preferably added in a proportion of 0.97/2 to 1.03/2 mol, more preferably 0.99/2 to 1.01/2 mol, based on one equivalent of amino groups in the diamine represented by the structural formula (1).

When the solution of the diamine represented by the structural formula (1) is prepared, a diamine may be used alone or two types of diamines may be used as a mixture. The mixing order of the monomers of the aforesaid aromatic tetracarboxylic dianhydride and the aforesaid aromatic diamine and the solvent is not particularly limited, but the monomers and the solvent may be mixed in any order. Where a solvent mixture is employed as the solvent, the solution of the diamine represented by the structural formula (1) is prepared by dissolving or dispersing the respective monomers in different solvents, mixing the resulting solutions or dispersions together, and allowing the monomers to react with each other with stirring at a predetermined temperature for a predetermined period.

The tetracarboxylic acid derivative represented by the structural formula (2) may be added in a solid or solution form to the aforesaid diamine solution with stirring. The tetracarboxylic acid derivatives may be used either alone or as a mixture of two of them.

Two or more types of the polyimide resin precursor solutions may be used as a mixture.

Specific examples of the aromatic tetracarboxylic acid derivative represented by the structural formula (2) include:
pyromellitic acid;
biphenyl-3,3',4,4'-tetracarboxylic acid;
benzophenone-3,3',4,4'-tetracarboxylic acid;
diphenyl sulfone-3,3',4,4'-tetracarboxylic acid;
diphenyl ether-2,3,3',4'-tetracarboxylic acid;
benzophenone-2,3,3',4'-tetracarboxylic acid;
naphthalene-2,3,6,7-tetracarboxylic acid;
naphthalene-1,4,5,7-tetracarboxylic acid;
naphthalene-1,2,5,6-tetracarboxylic acid;
diphenylmethane-3,3',4,4'-tetracarboxylic acid;
2,2-bis(3,4-dicarboxyphenyl)propane;
2,2-bis(3,4-dicarboxyphenyl)hexafluoropropane;
3,4,9,10-tetracarboxyperylene;
2,2-bis[4-(3,4-dicarboxyphenoxy)phenyl]propane;
2,2-bis[4-(3,4-dicarboxyphenoxy)phenyl]hexafluoropropane; and
dimethyl esters, diethyl esters and dipropyl esters of these acids. The aromatic tetracarboxylic acid derivatives may be used as a mixture of two or more of them.

Specific examples of the aromatic tetracarboxylic dianhydride represented by the structural formula (3) include dianhydrides of the aforesaid aromatic tetracarboxylic acids. These aromatic tetracarboxylic dianhydrides may be used as a mixture of two or more of them.

Specific examples of the aromatic diamine represented by the structural formula (4) include:
p-phenylenediamine;
m-phenylenediamine;
3,4'-diaminodiphenyl ether;
4,4'-diaminodiphenyl ether;
4,4'-diaminodiphenylmethane;
3,3'-dimethyl-4,4'-diaminodiphenylmethane;
2,2-bis[4-(4-aminophenoxy)phenyl]propane;.
1,2-bis(anilino)ethane;
diaminodiphenyl sulfone;
diaminobenzanilide;
diaminobenzoate;
diaminodiphenyl sulfide;
2,2-bis(p-aminophenyl)propane;
2,2-bis(p-aminophenyl)hexafluoropropane;
1,5-diaminonaphthalene;
diaminotoluene;
diaminobenzotrifluoride;
1,4-bis(p-aminophenoxy)benzene;
4,4'-bis(p-aminophenoxy)biphenyl;
diaminoanthraquinone;
4,4'-bis(3-aminophenoxyphenyl)diphenyl sulfone;
1,3-bis(anilino)hexafluoropropane;

1,4-bis(anilino)octafluorobutane;
1,5-bis(anilino)decafluoropentane; and
1,7-bis(anilino)tetradecafluoroheptane.

These aromatic diamines may be used as a mixture of two or more of them.

The solution (A) and the solution (B) are different in the content of the aromatic tetracarboxylic acid derivative. The precursor (A) is preferably present in a greater proportion than the precursor (B) by not smaller than 1% by mass, more preferably not smaller than 2% by mass, based on the total weight of the precursors (A) and (B).

In any of the aforesaid embodiments of the present invention, a derivative of an amine, a diamine, a dicarboxylic acid, a tricarboxylic acid and a tetracarboxylic acid having unsaturated bonds may additionally be employed for forming a crosslinked structure during the thermalcuring when the polyimide resin precursor solution is prepared. Usable as the unsaturated compounds are maleic acid, nadic acid, tetrahydrophthalic acid and ethynylaniline.

Even where the polyimide resin precursors are partially imidized depending on the conditions for preparing and drying the polyimide resin precursor and the like, no particular problem arises.

When the polyimide resin precursor solutions are prepared, a polyimide resin, a polyamide-imide resin or other heat-resistant resin soluble in the aforesaid solvent may be mixed with the solutions. Further, a silane coupling agent and any of various surface-active agents may be added in a very small amount to the solutions for improvement of adhesion (adhesiveness) and film properties.

Next, an explanation will be given to a production method for a flexible print wiring substrate according to the present invention.

The solution (A) and the solution (B) prepared according to each of the aforesaid embodiments are applied on the electrically conducting material, and dried for formation of precursor layers, which are then thermally cured to be imidized. Thus, the polyimide resin layer is formed which includes a coated film (A) resulting from the imidization of the precursor (A) contained in the solution (A) and a coated film (B) resulting from the imidization of the precursor (B) contained in the solution (B).

For the formation of the polyimide resin layer, the solution (B) is applied directly on the electrically conducting material, and the solution (A) is applied on a layer of the solution (B).

More specifically, the solution (B) is applied on a roughened surface of the electrically conducting material having a predetermined thickness so as to allow the coated film (B) to have a predetermined thickness after the thermalcuring. The applied solution (B) is preferably dried at a temperature of not higher than 200° C., more preferably not higher than 150° C. for formation of a precursor coated film as an inner layer. Further, the solution (A) is applied on the precursor coated film so as to allow the coated film (A) to have a predetermined thickness after the thermalcuring. The applied solution (A) is preferably dried at a temperature of not higher than 200° C., more preferably not higher than 150° C. for formation of a precursor coated film as an outer layer. Finally, a heat treatment is performed at a temperature not lower than 150° C. and not higher than 500° C., whereby the two precursor coated films are thermally cured to be imidized. Thus, the substrate for a flexible print wiring board is obtained which includes the coated film (A) and the coated film (B) formed as the insulative polyimide-based resin layer on the electrically conducting material.

The application of the solution (A) and the solution (B) may be carried out a plurality of times, and then the resulting coated films may be thermally cured. Further, two or more polyimide-based resin layers each including the coated film (B) and the coated film (A) may be formed.

Although polyimide resin precursors have been explained as the polyimide-based resin precursors, the substrate for a flexible print wiring board can be produced in the same manner by employing other polyimide-based resin precursors.

Further, a layer of another polyimide-based resin or any other heat-resistant resin may additionally be formed between the electrically conducting material and the polyimide-based resin layer for improvement of the adhesion (adhesiveness) or coating properties.

Where the two types of solutions (A) and (B) are applied on the electrically conducting material in the present invention, the thickness ($t1$) of the coated film (A) and the thickness ($t2$) of the coated film (B) after the thermalcuring may be the same, but the thickness ratio ($t2/t1$) is preferably 0.01 to 100, more preferably 0.1 to 10, further more preferably 0.3 to 3. The thickness ($t1+t2$) of the entire polyimide-based resin layer is typically 5 to 100 $\mu$m, preferably 10 to 50 $\mu$m.

Further, the polyimide-based resin layer preferably has an average linear expansion coefficient of 10 to 40 ppm. As long as the average linear expansion coefficient is within this range, the chemical structures of the polyimide-based resins of the two coated films or the linear expansion coefficients of the two polyimide-based resins of the coated films which depend on the chemical structures may be the same or different. Where the polyimide-based resin layers have different linear expansion coefficients, the linear expansion coefficient of the coated film (B) in contact with the electrically conducting material may be higher or lower than the linear expansion coefficient of the coated film (A).

In the present invention, a polyimide-based resin precursor, which allows resolving a residual strain generated in the polyimide-based resin layer formed by the thermalcuring of the precursor (B), is employed as the precursor (A). In other words, a residual strain of the polyimide-based resin formed by the thermalcuring of the precursor (B), which is generated between the precursor (B) and the electrically conducting material, is counterbalanced with that of the polyimide-based resin formed by the thermalcuring of the precursor (A), which is generated between the precursor (A) and the precursor (B). Thus, the residual strain generated in the polyimide-based resin between the electrically conducting material and the polyimide-based resin layer is resoled, so that a curl, a twist and a warp can be suppressed. Further, the substrate is improved in dimensional stability and electrical properties such as an insulation breakdown voltage, and excellent in heat resistance, adhesion, flexural resistance and chemical resistance.

In the present invention, the optimum thicknesses of the layers of the precursors (A) and (B) formed on the electrically conducting material are determined by a simple trial-and-error method, though the optimum thicknesses depend on the basic chemical structures of the polyimide-based resin precursors. Where the curl of the substrate is not sufficiently suppressed after the etching of the substrate, for example, the thicknesses of the precursor layers to be stacked are simply increased or reduced for adjustment.

For the application of the polyimide-based resin precursors on the electrically conducting material, a die coater, a multi-layer die coater, a gravure coater, a comma coater, a reverse roll coater, a doctor blade coater or the like can be employed as an industrial coating machine. For the thermalcuring of the applied precursors, a copper foil on which the precursors are applied is wound up into a roll and then heated in an inert gas atmosphere in an oven, or a heating zone is provided in a production line.

In the production method according to the present invention, the polyimide-based resin layer is formed from the specific polyimide-based resin precursors as described above, so that the curl, the twist and the warp are suppressed after formation of circuitry. In addition, the substrate for a flexible print wiring board is excellent in heat resistance, dimensional stability at high temperatures, adhesion and electrical properties.

Since the curl, twist and warp of the substrate for a flexible print wiring board are suppressed according to the present invention, electronic components can be mounted at a higher integration density on the substrate for a flexible print wiring board without any trouble. Further, the substrate for a flexible print wiring board is excellent in heat resistance, dimensional stability at high temperatures, adhesion and electrical properties.

EXAMPLES

The present invention will hereinafter be described more specifically by way of examples thereof. However, it should be understood that the invention not be limited to the examples.

Reference Examples 1 to 10 show preparation of polyimide resin precursor solutions. Compounds employed in Reference Examples 1 to 10 are abbreviated as follows.

| (Reaction components) | |
|---|---|
| BPDA: | biphenyl-3,3',4,4'-tetracarboxylic dianhydride |
| BPA-A: | biphenyl-3,3',4,4'-tetracarboxylic acid |
| BPA-E: | dimethyl biphenyl-3,3',4,4'-tetracarboxylate |
| PMDA: | pyromellitic dianhydride |
| ODA: | 4,4'-oxydianiline |
| PDA: | p-phenylenediamine |
| (Solvents) | |
| DMAc: | N,N-dimethylacetamide |
| NMP: | N-methyl-2-pyrrolidone |

Reference Example 1

First, 30.03 g (0.15 mol) of ODA, 91.92 g (0.85 mol) of PDA, 2330 g of DMAc and 999 g of NMP were put into a three-neck flask in a stream of nitrogen gas, and stirred for 30 minutes in the flask in ice water. Then, 294.22 g (1.00 mol) of BPDA was added to the flask, and the resulting mixture was stirred for one hour in the flask in a 40° C. water bath. Thus, a homogeneous polyimide resin precursor solution containing a polyamic acid was prepared. This solution was defined as a precursor solution (a).

Reference Example 2

First, 13.34 g (123.3 mmol) of PDA and 4.36 g (21.8 mmol) of ODA were put into a three-neck flask in a stream of nitrogen gas, then 245 g of DMAc and 105 g of NMP were added to the flask, and the resulting mixture was stirred. Then, 32.3 g (148.1 mmol) of PMDA was added to the flask, and the resulting mixture was stirred at a room temperature (25° C.) overnight (for 12 hours). Thus, a homogeneous polyamic acid solution having a solid concentration of 12.5% by mass was prepared. This solution was defined as a precursor solution (b).

Reference Example 3

First, 18.38 g (62.5 mmol) of BPDA was put into a three-neck flask in a stream of nitrogen gas, and then 122.5 g of DMAc was added to the flask for dissolution of BPDA. Then, 6.62 g (61.2 mmol) of PDA and 52.5 g of NMP were added to the flask, and the resulting mixture was stirred at a room temperature overnight. Thus, a homogeneous polyamic acid solution having a solid concentration of 12.5% by mass was prepared. This solution was defined as a precursor solution (c).

The precursor solutions (a) to (c) prepared in Reference Examples 1 to 3 contained no tetracarboxylic acid derivative, and the reaction components contained no trialkylamine. Therefore, the trialkylamine content was 0% by mass.

Reference Example 4

First, 81.0 g (0.80 mol) of triethylamine was slowly added dropwise to the polyamic acid solution (precursor solution (a)) prepared in Reference Example 1, and the resulting mixture was stirred at a room temperature for three hours. Thus, a solution of a triethylamine salt of the polyamic acid was prepared. This solution was defined as a precursor solution (d). The triethylamine content of the precursor solution was 2.1% by mass.

Reference Example 5

First, 202.38 g (2.0 mol) of triethylamine was slowly added dropwise to the polyamic acid solution (precursor solution (a)) prepared in Reference Example 1, and the resulting mixture was stirred at a room temperature for three hours. Thus, a solution of a triethylamine salt of the polyamic acid was prepared. This solution was defined as a precursor solution (e). The triethylamine content of the precursor solution was 5.1% by mass.

Reference Example 6

First, 12.65 g (0.125 mol) of triethylamine was slowly added dropwise to the polyamic acid solution (precursor solution (c)) prepared in Reference Example 3, and the resulting mixture was stirred at room temperature for three hours. Thus, a solution of a triethylamine salt of the polyamic acid was prepared. This solution was defined as a precursor solution (f). The triethylamine content of the precursor solution was 5.9% by mass.

Reference Example 7

First, 30.03 g (0.15 mol) of ODA, 91.92 g (0.85 mol) of PDA, 1180 g of DMAc and 506 g of NMP were put into a three-neck flask in a stream of nitrogen gas, and stirred for 30 minutes in the flask in ice water. Then, 250.09 g (0.85 mol) of BPDA was added to the flask, and the resulting mixture was stirred for one hour in a 40° C. water bath. Subsequently, 49.54 (0.15 mol) of BPA-A was added to the flask, and the resulting mixture was stirred in a 40° C. water bath for two hours and then in a 60° C. water bath for three hours. Thus, a homogeneous polyimide resin precursor solution containing a salt of a diamine and a tetracarboxylic acid was prepared. This solution was defined as a precursor solution (g). The content of a tetracarboxylic acid derivative in the precursor solution was 11.8% by mass.

Reference Example 8

A polyimide resin precursor solution was prepared in substantially the same manner as in Reference Example 7, except that 220.67 g (0.75 mol) of BPDA, 82.56 g (0.25 mol) of BPA-A, 992 g of DMAc and 425 g of NMP were employed. This solution was defined as a precursor solution (h). The content of a tetracarboxylic acid derivative in the precursor solution was 19.4% by mass.

Reference Example 9

A polyamide resin precursor solution was prepared in substantially the same manner as in Reference Example 7, except that BPA-E was employed instead of BPA-A. This solution was defined as a precursor solution (i). The content of a dimethyl tetracarboxylate in the precursor solution was 0.8% by mass.

Reference Example 10

The precursor solution (a) and the precursor solution (h) were blended in amounts such as to contain equivalent amounts of the polyimide resin precursors. Thus, a homogeneous polyimide resin precursor solution was prepared. This solution was defined as a precursor solution (j). The content of a tetracarboxylic acid derivative in the precursor solution was 9.7% by mass.

The thermalcuring rate indices of the polyimide resin precursors contained in the precursor solutions (a) to (j) prepared in Reference Examples 1 to 10 were determined. In Table 1, the results are shown together with the content of the tetracarboxylic acid derivative or the trialkylamine.

TABLE 1

| Reference Example | Precursor solution | Content of tetracarboxylic acid derivative (% by mass) | Content of Trialkylamine (% by mass) | Thermalcuring rate index (%) |
|---|---|---|---|---|
| 1  | (a) | 0    | 0   | 16 |
| 2  | (b) | 0    | 0   | 19 |
| 3  | (c) | 0    | 0   | 13 |
| 4  | (d) | 0    | 2.1 | 27 |
| 5  | (e) | 0    | 5.1 | 34 |
| 6  | (f) | 0    | 5.9 | 28 |
| 7  | (g) | 11.8 | —   | 67 |
| 8  | (h) | 19.4 | —   | 80 |
| 9  | (i) | 20.8 | —   | 82 |
| 10 | (j) | 9.7  | —   | 55 |

Example 1

A 35-$\mu$m thick copper foil produced by electrolysis was fixed in a metal frame. The precursor solution (a) was applied on the copper foil by means of a bar coater to such a thickness that the resulting coated film (B) had a thickness of 5 $\mu$m after thermalcuring. Then, the applied solution was dried at 130° C. for ten minutes for formation of an inner layer. Subsequently, the precursor solution (g) was applied on the inner layer in a room temperature atmosphere (25° C.) by means of a bar coater to such a thickness that the resulting coated film (A) had a thickness of 20 $\mu$m after thermalcuring. Then, the applied solution was dried at 100° C. for five minutes for formation of an outer layer. The inner and outer layers were subjected to a heat treatment by increasing the temperature from 100° C. to 360° C. in two hours and then keeping the temperature at 360° C. for two hours, whereby the precursor in the inner layer and the precursor in the outer layer were thermally cured to be imidized. Thus, a substrate for a flexible print wiring board (copper tensile board) was produced, which had a polyimide resin layer including the coated film (B) and the coated film (A) formed on the coated film (B).

Example 2

A substrate for a flexible print wiring board was produced in the same manner as in Example 1, except that the precursor solution (h) was employed instead of the precursor solution (g) and the coated film (B) and the coated film (A) respectively had thicknesses of 17 $\mu$m and 8 $\mu$m.

Adhesion between the copper foil and the resin layer of the substrate for a flexible print wiring board was measured by means of TENSILONTESTER (a versatile precision material tester MODEL-2020 available from Intesco).

For the measurement of the adhesion, the substrates were each cut into a 10-mm wide strip, which was fixed to an aluminum plate with its resin layer in contact with the aluminum plate by a two-sided adhesive tape having an adhesive applied on opposite sides thereof. In this state, the copper foil was peeled apart from the resin layer in a 180-degree direction at 50 mm/minute for determination of the adhesion. The result is excellent with an adhesion of 1.6 kg/cm.

Further, the substrate for a flexible print wiring board was immersed in an aqueous solution of ferric chloride, so that the copper foil was entirely etched away from the substrate by the ferric chloride aqueous solution. The linear expansion coefficient and second-order transition temperature Tg of the resin layer obtained after the etching were determined by means of a thermo-mechanical analyzer (TMA: TMA2940 available from TA Instruments). As a result, the linear expansion coefficient was 23 ppm, and the second-order transition temperature Tg was 345° C. It was found that the resin layer was excellent in dimensional stability and heat resistance.

Example 3

A substrate for a flexible print wiring board was produced in substantially the same manner as in Example 1, except that the precursor solution (i) was employed instead of the precursor solution (g) and the coated film (B) and the coated film (A) respectively had thicknesses of 14 $\mu$m and 11 $\mu$m.

Example 4

A substrate for a flexible print wiring board was produced in substantially the same manner as in Example 1, except that the precursor solution (j) was employed instead of the precursor solution (g) and the coated film (B) and the coated film (A) respectively had thicknesses of 4 $\mu$m and 21 $\mu$m.

Example 5

A substrate for a flexible print wiring board was produced in substantially the same manner as in Example 1, except that the precursor solution (j) and the precursor solution (h) were employed instead of the precursor solution (a) and the precursor solution (g), respectively, and the coated film (B) and the coated film (A) respectively had thicknesses of 12 $\mu$m and 9 $\mu$m.

Example 6

A substrate for a flexible print wiring board was produced in substantially the same manner as in Example 1, except that the precursor solution (b) and the precursor solution (d) were employed instead of the precursor solution (a) and the precursor solution (g), respectively, and the coated film (B) and the coated film (A) respectively had thicknesses of 14 $\mu$m and 11 $\mu$m.

Example 7

A substrate for a flexible print wiring board was produced in substantially the same manner as in Example 1, except that the precursor solution (c) and the precursor solution (e) were employed instead of the precursor solution (a) and the precursor solution (g), respectively, and the coated film (B) and the coated film (A) respectively had thicknesses of 14 μm and 11 μm.

Example 8

A substrate for a flexible print wiring board was produced in substantially the same manner as in Example 5, except that the coated film (A) had a thickness of 15 μm.

Example 9

A substrate for a flexible print wiring board was produced in substantially the same manner as in Example 1, except that the precursor solution (e) was employed instead of the precursor solution (g) and the coated film (B) and the coated film (A) respectively had thicknesses of 11 μm and 14 μm.

Example 10

A substrate for a flexible print wiring board was produced in substantially the same manner as in Example 1, except that the precursor solution (c) and the precursor solution (f) were employed instead of the precursor solution (a) and the precursor solution (g), respectively, and the coated film (B) and the coated film (A) respectively had thicknesses of 5 μm and 20 μm.

Comparative Example 1

A substrate for a flexible print wiring board was produced in substantially the same manner as in Example 1, except that the precursor solution (a) was employed instead of the precursor solution (g), and the coated film (B) and the coated film (A) respectively had thicknesses of 10 μm and 15 μm.

Comparative Example 2

A substrate for a flexible print wiring board was produced in substantially the same manner as in Example 1, except that the precursor solution (g) and the precursor solution (a) were employed instead of the precursor solution (a) and the precursor solution (g), respectively, and the coated film (B) and the coated film (A) respectively had thicknesses of 10 μm and 15 μm.

Comparative Example 3

A substrate for a flexible print wiring board was produced in substantially the same manner as in Example 1, except that the precursor solution (h) and the precursor solution (a) were employed instead of the precursor solution (a) and the precursor solution (g), respectively, and the coated film (B) and the coated film (A) respectively had thicknesses of 10 μm and 15 μm.

Comparative Example 4

A substrate for a flexible print wiring board was produced in substantially the same manner as in Example 1, except that the precursor solution (j) and the precursor solution (a) were employed instead of the precursor solution (a) and the precursor solution (g), respectively, and the coated film (B) and the coated film (A) respectively had thicknesses of 10 μm and 15 μm.

Comparative Example 5

A substrate for a flexible print wiring board was produced in substantially the same manner as in Example 1, except that the precursor solution (e) and the precursor solution (a) were employed instead of the precursor solution (a) and the precursor solution (g), respectively, and the coated film (B) and the coated film (A) respectively had thicknesses of 10 μm and 15 μm.

Comparative Example 6

A substrate for a flexible print wiring board was produced in substantially the same manner as in Example 1, except that the precursor solution (c) was employed instead of the precursor solution (g) and the coated film (B) and the coated film (A) respectively had thicknesses of 14 μm and 11 μm.

The precursor solutions applied for the formation of the inner layer and the outer layer and the thicknesses of the coated films in Examples 1 to 10 and Comparative Examples 1 to 6 are collectively shown in Table 2.

TABLE 2

| | Precursor solution | | Thickness of Coated film (μm) | |
|---|---|---|---|---|
| | Inner layer | Outer layer | B | A |
| Example | | | | |
| 1 | a | g | 5 | 20 |
| 2 | a | h | 17 | 8 |
| 3 | a | i | 14 | 11 |
| 4 | a | j | 4 | 21 |
| 5 | j | h | 12 | 9 |
| 6 | b | d | 14 | 11 |
| 7 | c | e | 14 | 11 |
| 8 | j | h | 12 | 15 |
| 9 | a | e | 11 | 14 |
| 10 | c | f | 5 | 20 |
| Comparative Example | | | | |
| 1 | a | a | 10 | 15 |
| 2 | g | a | 10 | 15 |
| 3 | h | a | 10 | 15 |
| 4 | j | a | 10 | 15 |
| 5 | e | a | 10 | 15 |
| 6 | a | c | 14 | 11 |

Further, the curl resistant properties of the substrate for a flexible print wiring boards obtained in Examples 1 to 10 and Comparative Examples 1 to 6 (pre-etching) and the curl resistant properties of the resin layers obtained by entirely etching away the copper foils from the substrates in the ferric chloride aqueous solution (post-etching) were determined. The results are shown in Table 3.

For the determination of the curl resistant properties, test strips having a length of 10 cm and a width of 10 cm were dried at 100° C. for 10 minutes, and the curvature radii of the resulting curls of the test strips were measured. A symbol X indicates that the curvature radius of the curl was smaller than 20 mm, a symbol Δ indicates that the curvature radius was smaller than 50 mm and not smaller than 20 mm, a symbol ○ indicates that the curvature radius was smaller than 90 mm and not smaller than 50 mm, and a symbol ⊙ indicates that the curvature radius was not smaller than 90 mm.

TABLE 3

| | Curl resistant properties | |
|---|---|---|
| Example | Pre-etching | Post-etching |
| 1 | ○ | ⊙ |

TABLE 3-continued

| | Curl resistant properties | |
|---|---|---|
| | Pre-etching | Post-etching |
| 2 | ○ | ⊚ |
| 3 | ○ | ⊚ |
| 4 | ○ | ⊚ |
| 5 | ○ | ⊚ |
| 6 | ○ | ○ |
| 7 | ○ | ○ |
| 8 | ○ | ⊚ |
| 9 | ○ | ○ |
| 10 | ○ | ○ |

| Comparative | Curl resistant properties | |
|---|---|---|
| Example | Pre-etching | Post-etching |
| 1 | ○ | x |
| 2 | ○ | x |
| 3 | ○ | x |
| 4 | ○ | x |
| 5 | ○ | Δ |
| 6 | ○ | Δ |

As shown in Table 3, the substrate for a flexible print wiring boards of Examples 1 to 10 each having an outer layer formed of a precursor having a higher thermalcuring rate index than that of an inner layer are less liable to be curled with excellent curl resistant properties. Therefore, electronic components can be mounted at a higher integration density on the substrate for a flexible print wiring boards. On the other hand, the substrate for a flexible print wiring board of Comparative Example 1 having an inner layer and an outer layer formed of precursors having the same thermalcuring rate indices, and the substrate for a flexible print wiring boards of Comparative Examples 2 to 6 each having an inner layer formed of a precursor having a higher thermalcuring rate index than that of an outer layer are more liable to be curled with poor curl resistant properties.

As apparent from Example 2, the substrate for a flexible print wiring board produced in accordance with the inventive production method is excellent in heat resistance, dimensional stability, and adhesion between the copper foil and the resin layer.

What is claimed is:

1. A production method for a substrate for a flexible print wiring board, the method comprising: applying a polyimide-based resin precursor solution directly on an electrically conducting material for formation of a polyimide-based resin precursor layer; and thermally curing the polyimide-based resin precursor layer for production of a flexible print wiring substrate having a polyimide-based resin layer; wherein a solution of a polyimide-based resin precursor (B), which is one out of two types of polyimide-based resin precursors, is applied directly on the electrically conducting material; wherein a solution of the other polymide-based resin precursor (A) is applied on a layer of the polyimide-based resin precursor (B) prior to thermalcuring, the polyimide-based resin precursor (A) counterbalancing residual strain generated in a polyimide-based resin formed by the thermalcuring of the polyimide-based resin precursor (B); wherein a polyimide-based resin precursor having a higher thermalcuring rate than the polyimide-based resin precursor (B) is employed as the polyimide-based resin precursor (A).

2. A production method for a substrate for a flexible print wiring board as set forth in claim 1, wherein the polyimide-based resin precursor (A) has a thermalcuring rate index higher than that of the polyimide-based resin precursor (B) by not smaller than 10%.

3. A production method for a substrate for a flexible print wiring board as set forth in claim 1, wherein the polyimide-based resin precursor (A) has a thermalcuring rate index higher than that of the polyimide-based resin precursor (B) by not smaller than 30%.

4. A production method for a substrate for a flexible print wiring board as set forth in claim 1, wherein the polyimide-based resin precursor (B) comprises a polyamic acid, or a salt or a mixture of a diamine represented by the following structural formula (1) and a tetracarboxylic acid derivative represented by the following structural formula (2), wherein the polyimide-based resin precursor (A) comprises a polyamic acid, or a salt or a mixture of a diamine represented by the following structural formula (1) and a tetracarboxylic acid derivative represented by the following structural for-mula (2), wherein the content of the tetracarboxylic acid derivative in the polyimide-based resin precursor (A) is greater than the content of the tetracarboxylic acid derivative in the polyimide-based resin precursor (B),

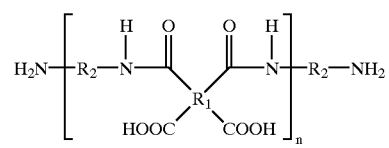

(1)

wherein $R_1$ is a tetravalent aromatic residue, $R_2$ is a divalent aromatic residue, and n is a real number not smaller than one which represents an average number,

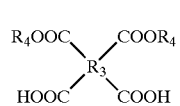

(2)

wherein $R_3$ is a tetravalent aromatic residue, and $R_4$ is a hydrogen atom or an alkyl group.

5. A production method for a substrate for a flexible print wiring board as set forth in claim 1, wherein the polyimide-based resin precursor (B) comprises a polyamic acid, a trialkylamine derivative of the polyamic acid, or a mixture of the polyamic acid and the trialkylamine derivative, wherein the polyimide-based resin precursor (A) comprises a polyamic acid, a trialkylamine derivative of the polyamic acid, or a mixture of the polyamic acid and the trialkylamine derivative, and has a greater trialkylamine content than the polyimide-based resin precursor (B).

6. A production method for a substrate for a flexible print wiring board, the method comprising: applying a polyimide-based resin precursor solution directly on an electrically conducting material to form a polyimide-based resin precursor layer; and thermalcuring the polyimide-based resin precursor layer for production of a flexible print wiring substrate having a polyimide-based resin layer; wherein a solution of a polyimide-based resin precursor (B) comprising a polyamic acid, or a salt or a mixture of a diamine represented by the following structural formula (1) and pyromellitic acid or biphenyl-3,4,3',4'-tetracarboxylic acid is applied directly on the electrically conducting material; wherein a solution of a polyimide-based resin precursor (A) comprising a polyamic acid, or a salt or a mixture of a diamine represented by the following structural formula (1) and pyromellitic acid or biphenyl-3,4,3',4'-tetracarboxylic acid and containing pyromellitic acid or biphenyl-3,4,3',4'-tetracarboxylic acid in a greater amount than the polyimide-based resin precursor (B) is applied on a layer of the polyimide-based resin precursor (B),

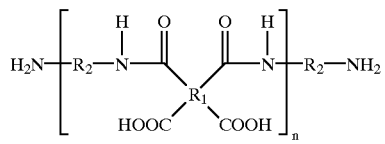
(1)

wherein $R_1$ is a tetravalent aromatic residue, $R_2$ is a divalent aromatic residue, and n is a real number not smaller than one which represents an average number.

7. A production method for a substrate for a flexible print wiring board, the method comprising: applying a polyimide-based resin precursor solution directly on an electrically conducting material to form a polyimide-based resin precursor layer; and thermalcuring the polyimide-based resin precursor layer for production of a flexible print wiring substrate having a polyimide-based resin layer; wherein a solution of a polyimide-based resin precursor (B) comprising a polyamic acid, a triethylamine derivative of the polyamic acid or a mixture of the polyamic acid and the triethylamine derivative is applied directly on the electrically conducting material; wherein a solution of a polyimide-based resin precursor (A) comprising a polyamic acid, a triethylamine derivative of the polyamic acid or a mixture of the polyamic acid and the triethylamine derivative and containing triethylamine in a greater amount than the polyimide-based resin precursor (B) is applied on a layer of the polyimide-based resin precursor (B).

* * * * *